US011408934B2

(12) United States Patent
Sarangi et al.

(10) Patent No.: US 11,408,934 B2
(45) Date of Patent: Aug. 9, 2022

(54) IN SYSTEM TEST OF CHIPS IN FUNCTIONAL SYSTEMS

(71) Applicant: Nvidia Corporation, Santa Clara, CA (US)

(72) Inventors: Shantanu Sarangi, Santa Clara, CA (US); Jae Wu, Santa Clara, CA (US); Andi Skende, Santa Clara, CA (US); Rajith Mavila, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 20 days.

(21) Appl. No.: 16/230,929

(22) Filed: Dec. 21, 2018

(65) Prior Publication Data
US 2019/0195947 A1 Jun. 27, 2019

Related U.S. Application Data

(60) Provisional application No. 62/609,775, filed on Dec. 22, 2017.

(51) Int. Cl.
*G01R 31/317* (2006.01)
*G01R 31/3187* (2006.01)
(Continued)

(52) U.S. Cl.
CPC ... *G01R 31/31724* (2013.01); *G01R 31/3177* (2013.01); *G01R 31/3187* (2013.01);
(Continued)

(58) Field of Classification Search
None
See application file for complete search history.

(56) References Cited

U.S. PATENT DOCUMENTS 5,513,190 A * 4/1996 Johnson ............... G06F 11/27
714/733
5,995,731 A * 11/1999 Crouch ............... G11C 29/26
714/718
(Continued)

FOREIGN PATENT DOCUMENTS

CN 1383200 A 12/2002
CN 1463031 A 12/2003
(Continued)

OTHER PUBLICATIONS

Adams—"High Performance Memory Testing—Design Principles, Fault Modeling and Self Test—Appendix B"—Springer Publishing (Year: 2003).*
(Continued)

*Primary Examiner* — April Y Blair
*Assistant Examiner* — Matthew W Wahlin

(57) ABSTRACT

Manufacturers perform tests on chips before the chips are shipped to customers. However, defects can occur on a chip after the manufacturer testing and when the chips are used in a system or device. The defects can occur due to aging or the environment in which the chip is employed and can be critical; especially when the chips are used in systems such as autonomous vehicles. To verify the structural integrity of the IC during the lifetime of the product, an in-system test (IST) is disclosed. The IST enables self-testing mechanisms for an IC in working systems. The IST mechanisms provide structural testing of the ICs when in a functional system and at a manufacturer's level of testing. Unlike ATE tests that are running on a separate environment, the IST provides the ability to go from a functional world view to a test mode.

22 Claims, 8 Drawing Sheets

(51) Int. Cl.
*G01R 31/3177* (2006.01)
*G06F 11/14* (2006.01)
*G06F 11/36* (2006.01)
*G06F 11/27* (2006.01)
*G06F 11/22* (2006.01)
*G01R 31/3181* (2006.01)
*G01R 31/3185* (2006.01)
*G06F 11/273* (2006.01)

(52) U.S. Cl.
CPC .......... *G01R 31/31813* (2013.01); *G01R 31/318555* (2013.01); *G06F 11/1417* (2013.01); *G06F 11/2268* (2013.01); *G06F 11/27* (2013.01); *G06F 11/273* (2013.01); *G06F 11/3688* (2013.01)

(56) References Cited

U.S. PATENT DOCUMENTS

| | | | |
|---|---|---|---|
| 6,560,740 B1 * | 5/2003 | Zuraski, Jr. | G01R 31/3187 714/727 |
| 6,944,808 B2 | 3/2005 | Rajsuman et al. | |
| 7,155,370 B2 * | 12/2006 | Nejedlo | G06F 11/27 702/186 |
| 7,243,318 B1 | 7/2007 | Mirza et al. | |
| 7,308,623 B2 | 12/2007 | Slobodnik et al. | |
| 7,472,051 B2 | 12/2008 | Mariani et al. | |
| 7,673,200 B2 | 3/2010 | Jan et al. | |
| 7,725,784 B2 | 5/2010 | Laouamri et al. | |
| 7,761,763 B2 | 7/2010 | Shin et al. | |
| 8,074,133 B2 | 12/2011 | Ziaja et al. | |
| 8,145,958 B2 | 3/2012 | Aitken et al. | |
| 8,935,584 B2 | 1/2015 | Wan et al. | |
| 9,285,818 B2 * | 3/2016 | Rosik | G05F 3/02 |
| 9,400,311 B1 | 7/2016 | Malik et al. | |
| 9,575,861 B2 | 2/2017 | Hong | |
| 9,612,930 B2 | 4/2017 | Shanbhogue et al. | |
| 9,658,949 B2 | 5/2017 | Shin et al. | |
| 9,805,826 B2 | 10/2017 | Sang et al. | |
| 9,874,608 B2 | 1/2018 | Hamid et al. | |
| 2002/0178416 A1 * | 11/2002 | Chen | G06F 11/27 714/733 |
| 2007/0061621 A1 * | 3/2007 | Bae | G01R 31/318572 714/25 |
| 2008/0104458 A1 | 5/2008 | Uchida | |
| 2012/0089879 A1 * | 4/2012 | Bartenstein | G01R 31/318342 714/738 |
| 2014/0132291 A1 * | 5/2014 | Somachudan | G01R 31/31724 324/750.3 |
| 2014/0173346 A1 | 6/2014 | Bastimane | |
| 2016/0266199 A1 * | 9/2016 | Kurosawa | G01R 31/31724 |
| 2016/0358669 A1 * | 12/2016 | Keshava | G11C 29/38 |
| 2017/0115353 A1 * | 4/2017 | Sonawane | G01R 31/318555 |
| 2017/0350940 A1 * | 12/2017 | Huott | G01R 31/31724 |
| 2020/0058364 A1 * | 2/2020 | Troy | G01R 31/318552 |

FOREIGN PATENT DOCUMENTS

CN 100346167 C * 10/2007
JP 2004061114 A * 2/2004

OTHER PUBLICATIONS

Yi, et al.; "Aging Test Strategy and Adaptive Test Scheduling for SoC Failure Prediction"; 2010 IEEE 16th International On-Line Testing Symposium; Sep. 2, 2010; pp. 21-26.

Huang, et al.; "A Self-Test Methodology for IP Cores in Bus-Based Programmable SoCs"; Department of ECE, University of California; Aug. 7, 2002; pp. 1-7.

Ganga; "Core Based SoC Testing and Test Integration"; 2013; pp. 32-73.

Dutta, et al.; "A BIST Implementation Framework for Supporting Field Testability and Configurability in an Automotive SOC"; Texas Instruments; undated; 6 pgs.

Xu, et al.; "SOC Test-Architecture Optimization for the Testing of Embedded Cores and Signal-Integrity Faults on Core-External Interconnects"; ACM Transactions on Design Automation of Electronic Systems, vol. 14, No. 1, Article 4; Jan. 2009; 27 pgs.

Lang, et al.; "Using on-chip Test Pattern Compression for Full Scan SoC Designs"; Motorola SPS; undated; 6 pgs.

Baleani; "Fault-Folerant Platforms for Automotive Safety-Critical Applications"; CASES '03; Oct. 30-Nov. 2, 2003; 8 pgs.

"Scan Test"; Semiengineering.com; Semiconductor Engineering; Feb. 8, 2017; 10 pgs.

* cited by examiner

FIG. 1

IN SYSTEM TEST OF CHIPS IN FUNCTIONAL SYSTEMS

CROSS-REFERENCE TO RELATED APPLICATION

This disclosure claims the benefit of U.S. Provisional Application No. 62/609,775, filed by Shantanu Sarangi, et al. on Dec. 22, 2017, entitled "IN SYSTEM TEST," and incorporated herein by reference in its entirety.

TECHNICAL FIELD

This application is directed, in general, to device testing and, more specifically, to testing chips while in the field.

BACKGROUND

Manufacturers test chips before shipping to determine if the chips are functioning properly and if there are manufacturing defects such as structural faults. Automated test equipment (ATE) is used to perform structural tests on chips before being shipped. Structural tests often use design-for-test (DFT) technologies to check for manufacturing defects and ensure devices have been correctly fabricated. As more chips are used in products tasked with handling safety critical operations (e.g., autonomous driving), it is becoming important to also check and ensure that such chips are free from structural faults that can occur during the lifetime of the final product.

Traditionally, the most common method of testing chips in the field involves using functional patterns which have long development cycles and are difficult to quantify for fault coverage. Especially for new architectures, testing methods using functional patterns require many iterations to develop new tests based on coverage gaps that are identified by long, simulation-based methods. Functional pattern testing also cannot be run autonomously on the final product and lacks granularity in the diagnosis of failures.

There are some testing methods in the industry which support running logic and memory built-in self-test (BIST). Such techniques, however, support only a fixed set of tests, fault models and algorithms which cannot be modified in the field. These techniques are limited in the test conditions that can be selected and have limited diagnosis capabilities similar to functional test techniques. A mechanism that checks chips for faults, such as silicon faults, after shipping will enhance the overall safety and reliability of the chips and the products in which they operate.

SUMMARY

In one aspect, an in-system test (IST) hardware controller included within a chip of a functional computing platform is disclosed. In one embodiment, the IST hardware controller includes: (1) an interface configured to receive test patterns for structural testing of a chip of a functional computing platform, and (2) a processor configured to direct the test patterns to a testing controller of the chip for in-system testing of the chip.

In another aspect, a method of performing in-system testing of a chip of a functional system is disclosed. In one embodiment, the method includes: (1) preparing the functional system for the in-system testing, (2) initiating the in-system testing employing an IST hardware controller of the chip, (3) obtaining test patterns for the in-system testing, and (4) directing the test patterns to test controllers of the chip to perform the in-system testing.

In yet another aspect, the disclosure provides an integrated circuit (IC) within a functional system. In one embodiment, the IC includes: (1) components of the functional system, and (2) a system-on-a-chip (SoC) having an IST hardware controller communicatively coupled to the components of the functional system, wherein the IST hardware controller is configured to direct in-system testing of the SoC employing testing controllers of the SoC.

BRIEF DESCRIPTION

Reference is now made to the following descriptions taken in conjunction with the accompanying drawings, in which:

FIG. 1 illustrates a diagram of an embodiment of an integrated circuit constructed according to the principles of the disclosure;

DETAILED DESCRIPTION

Figure 2:
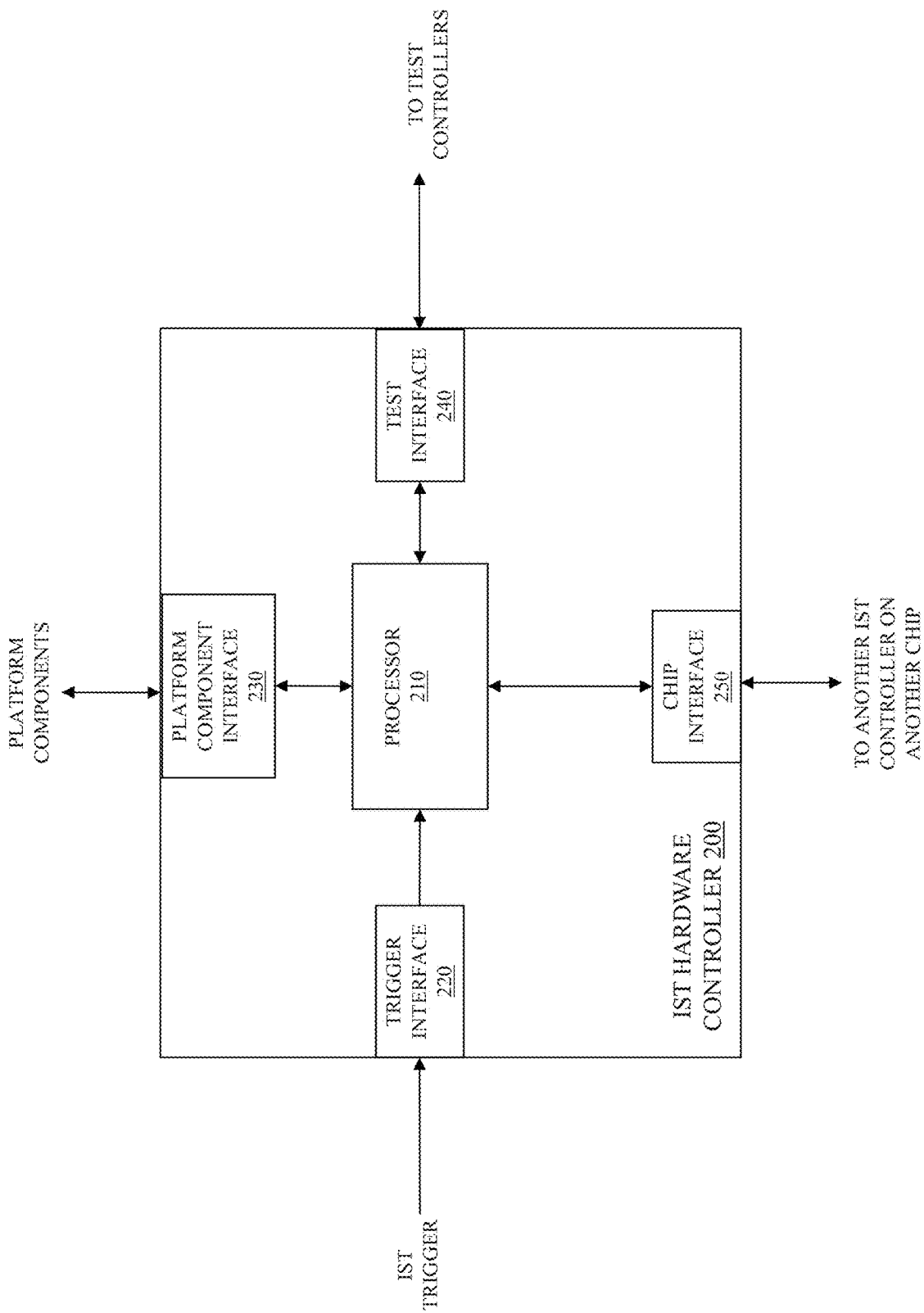
FIG. 2 illustrates a block diagram of an embodiment of an in-system test (IST) hardware controller constructed according to the principles of the disclosure.

As noted above, manufacturer testing is typically performed on chips before the chips are shipped to customers. However, defects can occur on a chip after the manufacturer testing and when the chips are used in a system or device. The defects can occur due to aging or the environment in which the chip is employed. The defects can be critical; especially when the chips are used in-systems such as autonomous vehicles.

The disclosure provides a testing scheme, in-system test (IST), for testing integrated circuits (IC) in the field. The IST can detect structural faults of the IC by running logic or memory tests in the field. The IC can be, for example, a complex IC such as a chip, a system-on-a-chip (SoC), or a computing platform that includes a chip and a processor. The processor can be a graphics processing unit (GPU) or a central processing unit (CPU). IST includes software and hardware that cooperate to provide the testing for the IC. In one example, IST uses a combination of hardware and software components to test a standalone SoC or a discrete GPU paired with a SoC and can be executed during different states of the system operation. The SoC can be Tegra®, which may be obtained from NVIDIA Corporation, 2701 San Tomas Expressway, Santa Clara, Calif. 95050.

The disclosed IST enables self-testing mechanisms for an IC in working systems to verify the structural integrity of the IC during the lifetime of the product. The IST mechanisms provide structural testing of the ICs when in a functional system and at a manufacturer level of testing. The IST provides the ability to go from a functional world view to a test mode. Unlike ATE tests that are running on a separate environment, the IST disclosed herein merges the testing mode in the actual usage of the IC in the platform. In one example, IST is initiated by a transition from functional mode to test mode. This transition can be accomplished when the system is powered off or when the system is booting up.

The hardware component of the IST can be a hardware controller that is dedicated for IST. The IST hardware controller can be located on the IC to be tested, such as a SoC and a GPU. The test data and results can be stored in flash memory of an embedded Multi-Media Controller (EMMC) that is part of the computer platform that includes the IC. The IST hardware controllers communicate with various components of the IC as well as platform components to execute the IST tests.

The type of targeted faults, tests, testing conditions and test application sequence is flexible and can be updated over the life cycle of a product. The test patterns, for example, can be updated in a non-volatile storage through various firmware image update mechanisms. Over-the-air (OTA) programming can be used for the updates in various embodiments. A few non-limiting examples of fault models that are supported by the in-system testing are stuck-at, transition, cell aware, small delay and bridging. The in-system testing can run deterministic automatic test pattern generation (ATPG) as well as classic Logic Built-in self-test (LBIST) for these fault models to achieve high fault coverage. For memory, in addition to common fault models such as stuck-at fault, transition fault, coupling fault, etc., the in-system testing also covers additional faults specific to full custom memory design features such as masked write failure, write collision, shadow copy commit, and restore failure. Depending on platform requirements, different types of tests can be added to target different fault models. This gives the IST mechanism complete scalability; and frees the user to make tradeoffs related to test time (which translates to available latency budget for power off/on events) and desired test coverage. This scalability is driven by configuration parameters captured in the EMMC and interpreted at IST runtime.

Figure 1:
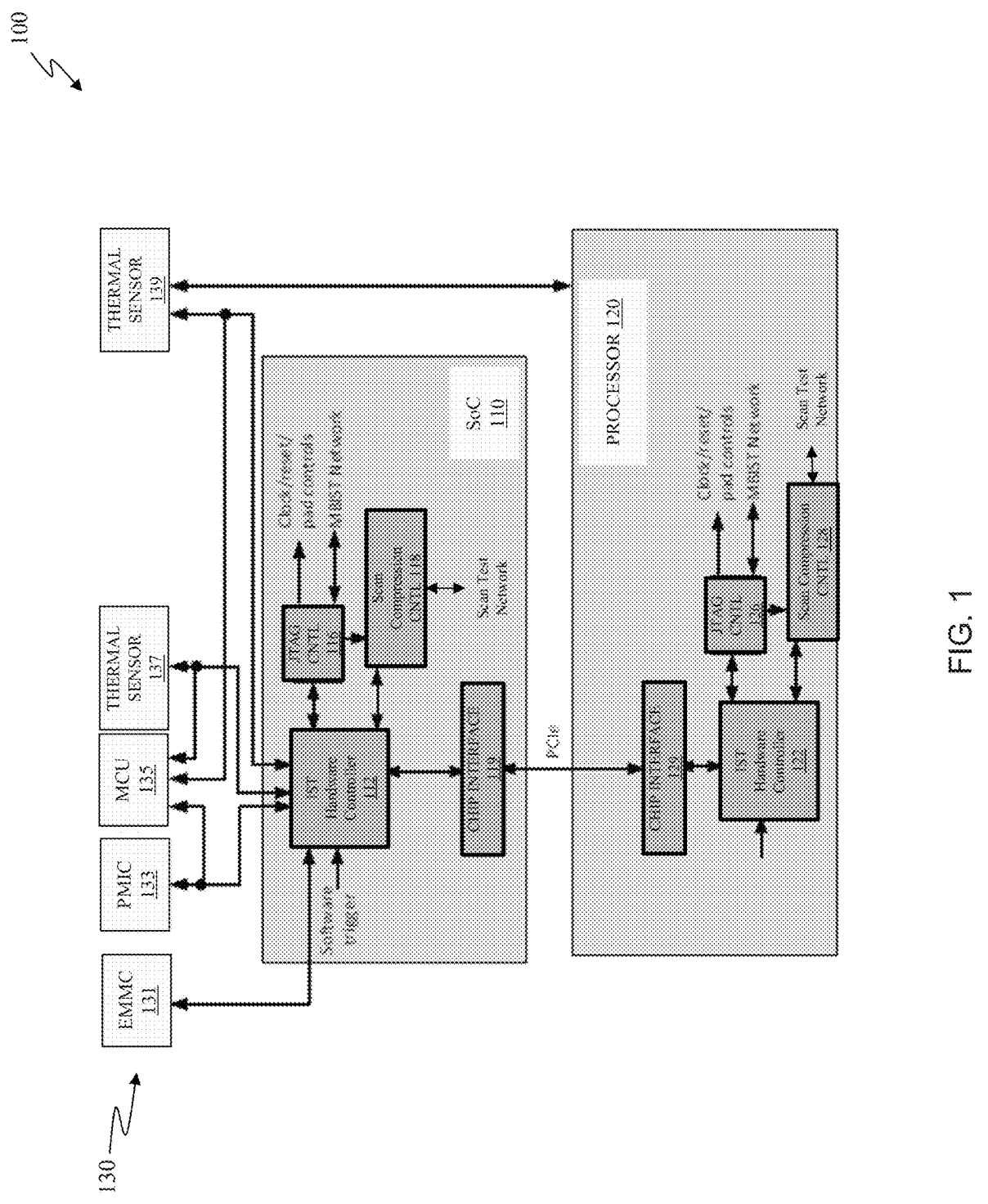

FIG. 1 illustrates a block diagram of an embodiment of an IC 100 constructed according to the principles of the disclosure. The IC 100 is a functional computing platform having two chips—a SoC and a processor—that both include an IST hardware controller. The IC 100 also includes various platform components that interact with at least one of the IST hardware controllers during in-system testing of the IC 100. The IC 100 is part of a functional system that has completed production and has been deployed (or is ready to be deployed) in the field. Example functional systems can include (but are not limited to) deployed autonomous vehicles; other suitable embodiments include any application with integrated chips where defects can develop in the field and/or where detecting defects early is critical.

The IC 100 includes a SoC 110, a processor 120, and platform components EMMC 131, power management IC (PMIC) 133, microcontroller 135, thermal sensor 137, and thermal sensor 139. The various platform components are referred to collectively as platform components 130. Connections between the components of the IC 100 can be via conventional means.

The SoC 110 includes an IST hardware controller 112, a JTAG controller 116, a scan compression controller 118, and a chip interface 119. The processor 120 also includes an IST hardware controller 122, a JTAG controller 126, a scan compression controller 128, and a chip interface 129. The SoC 110 and the processor 120 can include additional components that are not illustrated but are typically included in a SoC or a processor. For example, the SoC 110 can include an operational controller for the SoC which is distinct from the dedicated IST hardware controller 112. Other components include input/output contacts and control circuitry, a memory built in self-test (MBIST) network, a scan test network, a boot processor, and functional logic.

The IST hardware controller 112 includes logic circuitry that directs in-system testing for the SoC 110 and communication interfaces that communicate with the platform components 130, the JTAG controller 116, the scan compression controller 118, and the chip interface 119, during the in-system testing. The IST hardware controller 112 advantageously allows in-system testing of a chip in a functional system. The IST hardware controller 112 receives an IST trigger to initiate the IST. The IST trigger can be a software trigger. In one application, the IST trigger is provided by the microcontroller 135 during a boot process for the SoC 110. The boot process can be a power-up or power-down process for the SoC 110.

After receiving the IST trigger, the IST hardware controller 112 fetches test patterns from the EMMC 131 and communicates the test patterns to the JTAG controller 116 and the scan compression controller 118 for performing the IST. As such, the IST hardware controller 112 is configured to interact with both the JTAG controller 116 and the scan compression controller 118 to initiate in-system testing by applying test patterns to the MBIST network and the scan test network of the SoC 110.

The JTAG controller 116 and the scan compression controller 118 can be conventional controllers located in chips that are used to control testing of MBIST networks and scan networks of the chips. The JTAG controller 116 can be compliant with the IEEE 1500 standard.

The chip interface 119 is dedicated for communications between the IST hardware controller 112 and the IST hardware controller 122 of the processor 120. The chip interface 119 can be a multiplexer ("mux"). The chip interface 119 communicates with the IST hardware controller 122 via the chip interface 129; which is also dedicated for IST communication between the IST hardware controllers 112, 122. In one example, the IST hardware controllers 112, 122, establish a PCIe link between the chip interfaces 119, 129, to transport test data and results between the processor 120 and the EMMC 131. The chip interfaces 119, 129, allow multiplexing an IST specific data path onto a PCIe data bus. An IST specific protocol can be used to communicate over the PCIe data bus between the chip interfaces 119, 129. As such, the chip interfaces 119, 129, can be paired such that they only understand each other. In some embodiments the chip interfaces 119, 129, or one of the chip interfaces 119, 129, can be integrated within their respective IST hardware controller.

The IST hardware controller 122 is configured to perform in-system testing for the processor 120. The IST hardware controller 122 can function similarly to the IST hardware controller 112 by delivering test patterns from the EMMC 131 to the JTAG controller 126 and the scan compression controller 128 for IST of the processor 120. As with the JTAG controller 116 and the scan compression controller 118, the JTAG controller 126 and the scan compression controller 128 can be conventional controllers typically located within a processor, such as a GPU. As noted above, unlike the IST hardware controller 112, the IST hardware controller 122 communicates with the EMMC 131 via the muxes 119, 129, to receive test patterns for the processor 120 and provide test results.

The platform components 130 can be conventional components that are included in functional systems. The platform components 130 also include additional functionality associated with IST as disclosed herein. For example, the EMMC 131 stores the structural test patterns that are used for the IST and the test results of the IST. In this embodiment, the IST hardware controller 112 has a direct communication path with the EMMC 131.

The PMIC 133 provides power management for the system 100 and the microcontroller 135 manages operations of the system 100 and controls the boot process for the system 100 to enter the functional mode. The boot process for functional mode includes standard boot commands. In addition, the microcontroller 135 controls transitioning from booting for the functional mode to the IST mode. As such, the microcontroller 135 places the SoC 110 and the processor 120 in IST mode. Once the SoC 110 is powered-on, the microcontroller 135 goes through the boot process wherein a portion of the boot code directing the boot process extracts test information that is used to run IST mode and load software blocks that will direct setting up the system 100 for IST. In some embodiments, the SoC 110 may include a boot processor that runs a boot ROM and gets the SoC 110 up and running. In these embodiments, the boot processor can include software commands that control the transition to IST mode.

Preparing the system for IST mode includes preparing all the clocks and the voltage settings of the SoC 110 for testing so that in-system testing can be run with correct clock settings, correct voltage settings, and correct I/O controls to isolate the SoC 110 from other components of the IC 100 while in the IST mode and notify the other components that the SoC 110 is entering IST mode. Before entering the IST mode, the I/O contacts are placed in a platform friendly state that is maintained during the IST. The PMIC 133 and the thermal sensors 137, 139, are also set for in-system testing. Accordingly, the thermal sensors 137, 139, are used for the IST mode instead of for functional behavior. Transitioning to the IST mode results in the microcontroller 135 focusing on IST triggers, such as from the thermal sensors 137, 139, and ignoring other triggers when in the IST mode.

The thermal sensor 137 is an external thermal sensor dedicated to the SoC 110 and the thermal sensor 139 is an external thermal sensor dedicated to the processor 120. Different triggers are set for the thermal sensor 137, 139, for the IST mode compared to triggers used for the functional mode.

FIG. 2 illustrates a block diagram of an embodiment of an in-system test (IST) hardware controller 200 constructed according to the principles of the disclosure. The IST hardware controller 200 is located within a chip of a functional computing system that is configured to perform in-system testing of the chip. The functional computing system can be, for example, a computing platform. The IST hardware controller 200 includes a processor 210 to direct operation of the IST and interfaces for communicating with other components. The interfaces include a trigger interface 220, an external component interface 230, a testing interface 240, and a chip interface 250. The trigger interface 220, the external component interface 230, and the testing interface 240 can be constructed as conventional communication ports from which signals are received and transmitted. As discussed above with respect to the chip interfaces 119, 129, the chip interface 250 is specifically dedicated for IST communications. In some applications, the chip interface 250 is used to communicate with platform components.

Figure 5A:
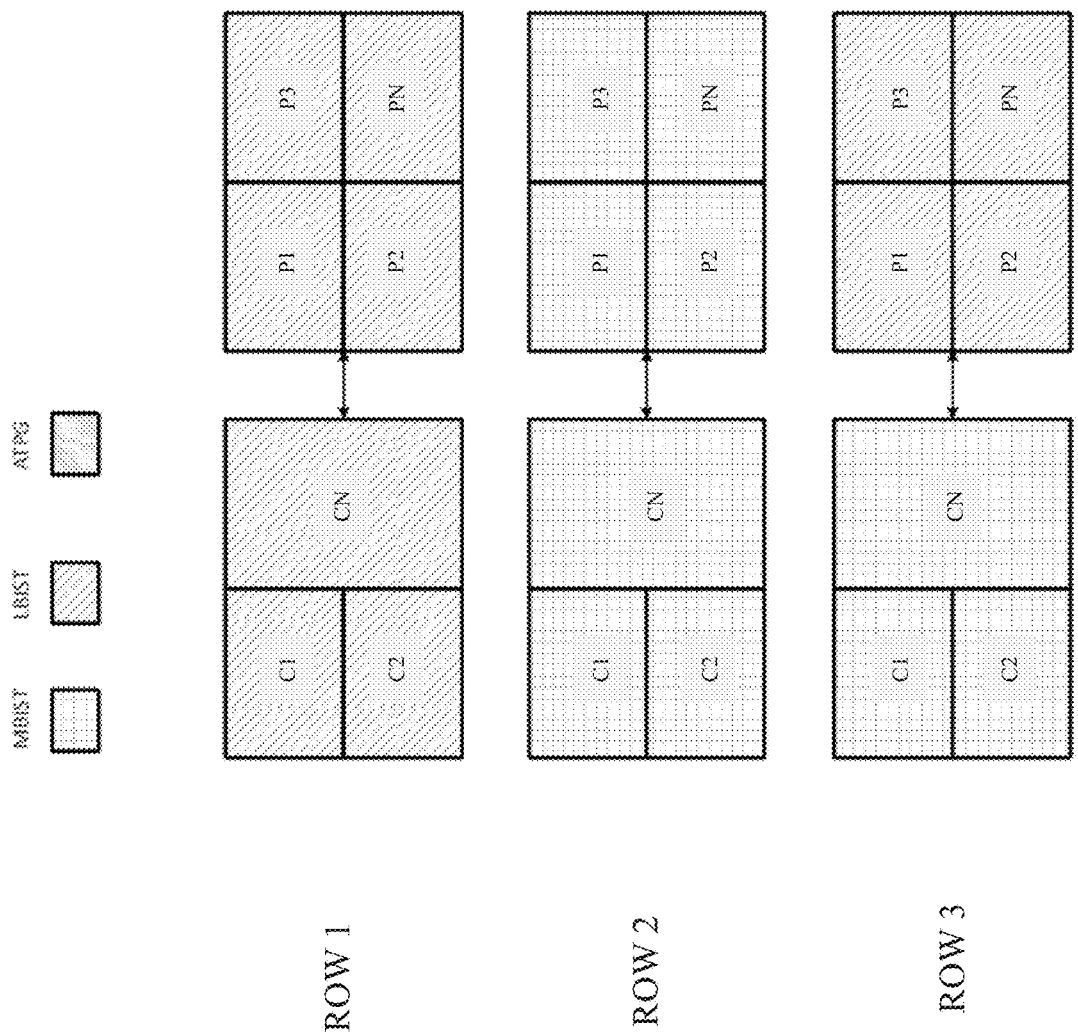
FIGS. 5A-5C illustrate embodiments of a test scheduling in accordance with the disclosure.
Figure 5B:
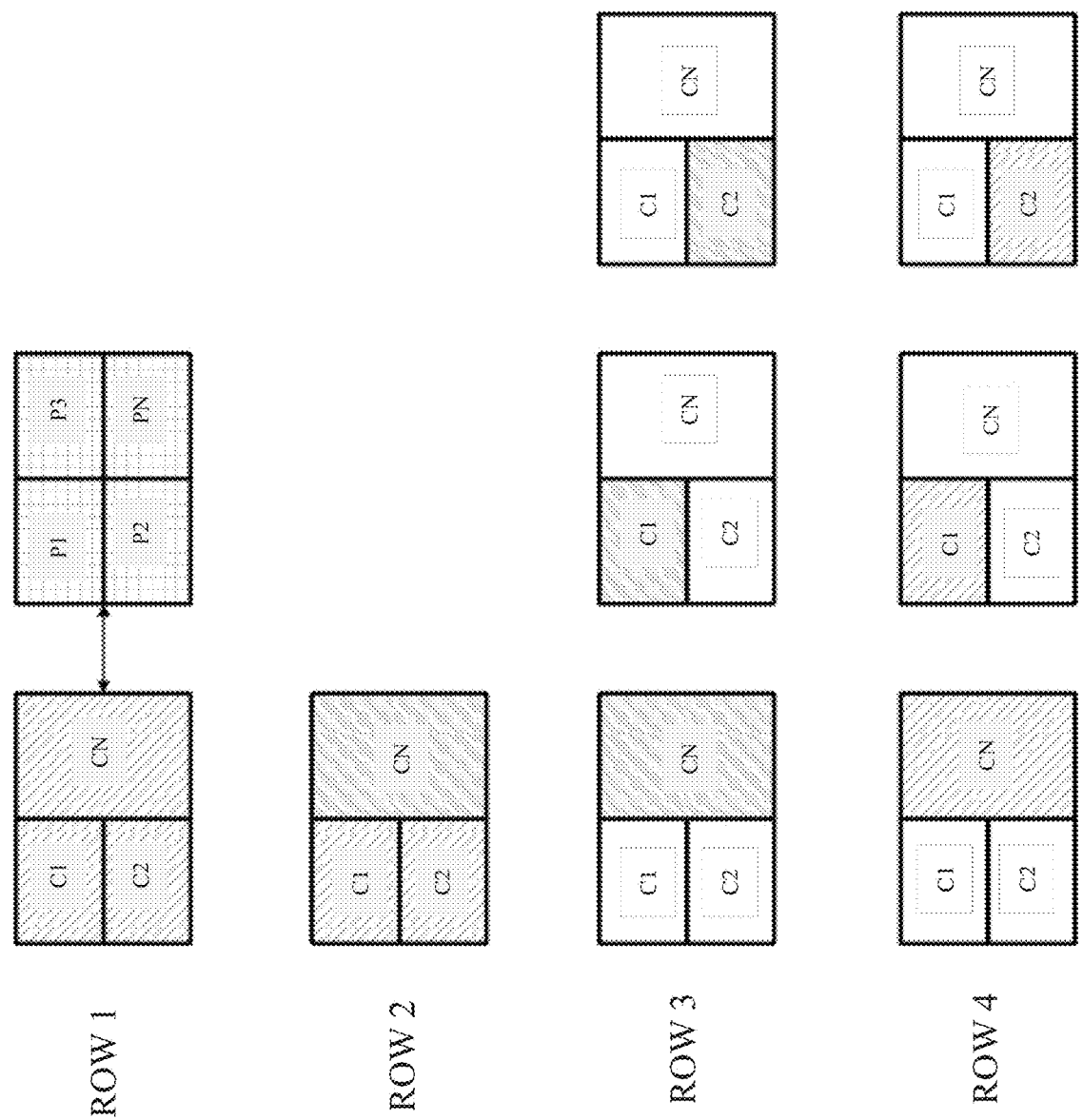
Figure 5C:
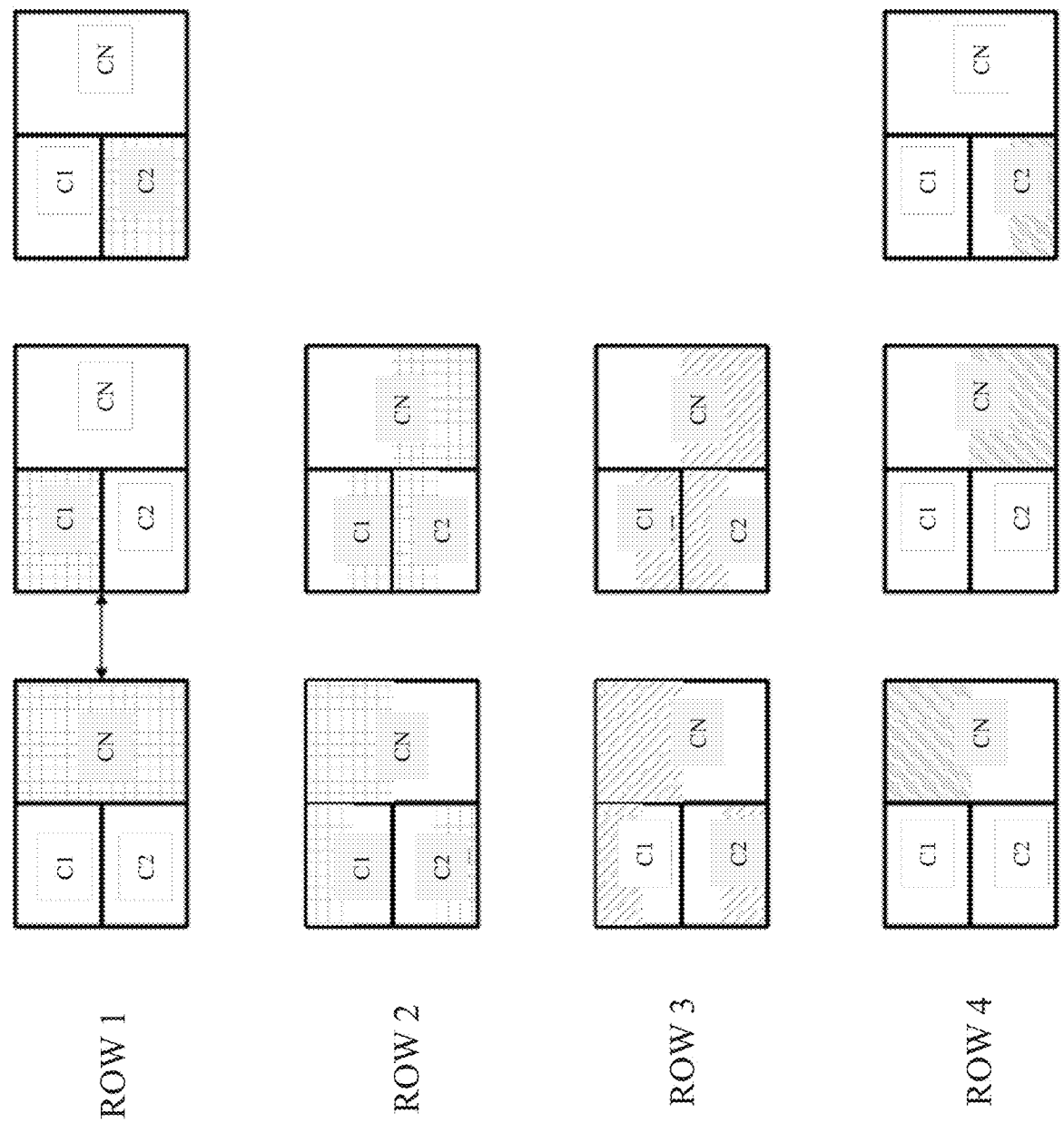

The processor 210 controls the in-system testing of the chip. As such, the processor 210 is configured to initiate the in-system testing for the chip, obtain test patterns for the in-system testing, direct delivery of the test patterns to test controllers of the chip, and direct the delivery of the test results of the in-system testing for storage. The processor 210 can control the order of testing different portions of the chip. Additionally, the processor 210 can cooperate with another IST hardware controller of another chip to coordinate testing for both of the chips. FIGS. 5A to 5C provide examples of the different types of in-system testing and the coordination of the testing of the chips.

The trigger interface 220 is configured to receive an IST trigger to initiate IST in the IST hardware controller 200. The IST trigger can be a software trigger received from a platform component, such as a microcontroller or a boot controller, or another component external to the IST hardware controller 200.

The platform component interface 230 is configured to communicate with various components such as the platform components 130 of FIG. 1. The testing interface 240 is configured to communicate with on-chip test controllers, such as a JTAG controller and a scan compression controller, to transmit test patterns for in-system testing and receive results of the tests.

The chip interface 250 performs IST communication with another IST hardware controller. As such, in some applications the chip interface 250 may not be employed for in-system testing. The chip interface 250 can be used to establish a PCIe link for communication with the other IST hardware controller by allowing multiplexing of an IST specific data path onto a PCIe data bus.

Figure 3:
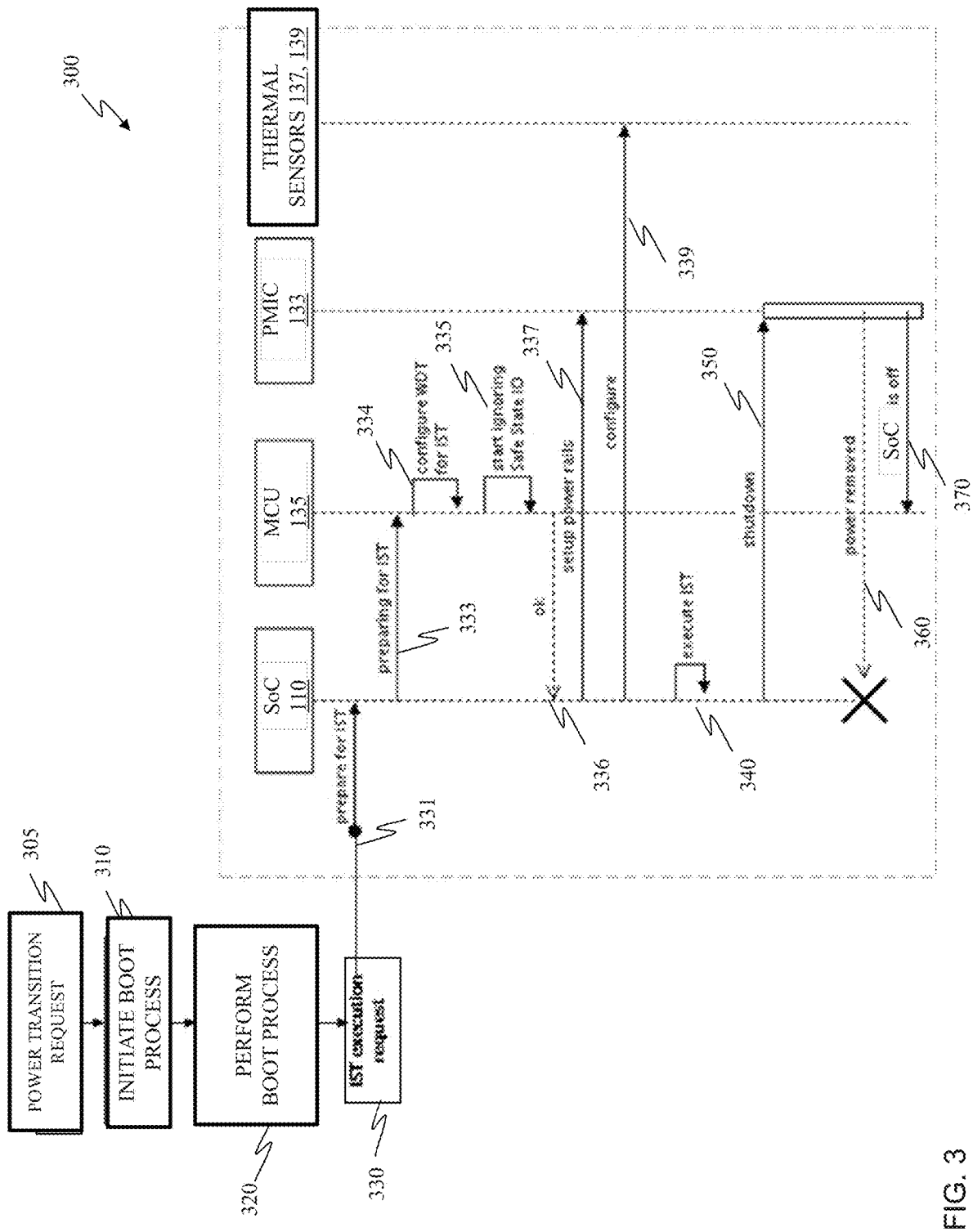
FIG. 3 illustrates a sequence diagram of an embodiment of a method for in-system testing carried out according to the principles of the disclosure.

FIG. 3 illustrates a sequence diagram of an example sequence 300 of in-system testing for a chip of a functional computing system carried out according to the principles of the disclosure. The functional computing system can be, for example, a computing platform. The sequence 300 refers to components of the functional computing system of FIG. 1, the IC 100, as an example. The sequence 300 begins or is initiated in a step 305 with a power transition request. The power transition request can be for the IC 100. The power transition request can be a power on request or a power off request. Thus, the IST architecture disclosed herein is flexible to support self-tests based on power on or power off request. The sequence 300 remains the same regardless the power transition that boots the SoC 110 into IST mode. The power transition request can be initiated by a user or system that employs the IC 100.

In a step 310, a boot process is initiated. The boot process can be started by a component of the IC 100 such as a boot processor or the MCU 135. For example, the power transition request can be first recognized by the MCU 135 which in turn starts the boot process for the SoC 110. The boot process for the SoC 110 precedes the boot process for the connected processor 120. The boot process can be a cold boot process which is a boot following a reset pin de-assertion, such as of a reset pin of the SoC 110. After initiation of the boot process, the boot process is performed in step 320. The boot process includes steps typically performed during a boot process for a chip. The boot process also includes additional steps such as checking on the results from previous in-system testing and generating a request to execute the in-system testing. The boot process can include code for executing steps associated with the in-system testing. The request to execute the in-system testing is denoted in step 330.

From step 330, multiple software-initiated steps are performed to prepare the chip and system, e.g., SoC 110 and the IC 100, for the in-system testing. The software-initiated steps can direct the SoC 110 to prepare for the in-system testing in a step 331. The MCU 135 is employed to prepare the IC 100 for the in-system testing in a step 333. The MCU 135 is used to enable watchdog timers in a step 334 and disable certain monitoring in a step 335, such as start ignoring Safe States for I/O contacts, until the tests are completed. Confirmation (e.g., an acknowledgement) of the configuring is provided in step 336 from the MCU 135 to the SoC 110. Preparing the SoC 110 and the IC 100 for the in-system testing includes configuring the SoC 110 and the IC 100 to operate in the required testing condition for power, clock sources/frequencies and voltage. Configuring the voltage is denoted in step 337 with a communication to the PMIC 133 and configuring the thermal sensors 137, 139, for the testing is denoted in step 339. The conditions can be tuned based on the IC 100 and additional test coverage requirements.

After preparing for the in-system testing, the IST mode is enabled in a step 340. Step 340 can include preparing the IST hardware controller inside the SoC 110 and the processor 120 for testing by asserting link disable functionality for active PCIe links to enable creating a dedicated communication path between the IST hardware controllers during testing. The SoC 110 and processor 120 go through a request/acknowledge to disable the link and proceed with configuring the IOs into a safe state to ensure that IOs stay un-affected through the testing phase. In one or more embodiments, both of the IST hardware controllers are configured for the in-system testing.

The IST hardware controllers on the SoC 110 and the processor 120 establish the dedicated communication path, a PCIe link, via training. The training can be conventional training used to establish a PCIe link. For example, the dedicated path (e.g., PCIE link) is provided between chip interfaces 119 and 129. To establish the communication path, the IST hardware controllers (112, 122) switch the PCIe physical (UPHY) lane ownership from a PCIe controller to the IST controllers 112, 122. The IST controllers subsequently bring up the UPHY lane to a usable state through (for example and without limitation), a handshake process.

In one embodiment this is purely a hardware-based mechanism without any software or functional PCIe controller involvement. The IST hardware controller of the SoC 110 starts the IST sequences and communicates to the processor 120 IST hardware controller via packets fetched from the EMMC 131. Prior to executing tests, the IST hardware controllers sample various software register states into shadow registers, which will hold the existing states without being affected by scan testing as the IST hardware controllers also program additional registers to setup test paths for scan and memory built-in self-test (MBIST). The shadow registers can be located within the test logic of the SoC 110. Additionally, the IST hardware controllers execute tests based on the test data from the EMMC 131 and store the test results back into EMMC 131. After all the testing is done, the IST hardware controller of the SoC 110 initiates a shutdown of the IC 100 in a step 350. The PMIC 133 then removes power to the SoC 110 in a step 360 and powers down the IC 100 employing the MCU 135 in a step 370. System software reads the results from EMMC 131 the next time the system is powered up. Based on previously established metrics, the system software may determine whether the SoC 110 and processor 120 meets the functional safety targets to be allowed to continue to function as a processing unit.

Thermal limits of the IC 100 should ideally be adhered to during IST execution. As internal thermal sensing mechanism also goes through scan operation as part of the in-system testing, it is desired (e.g., required in certain embodiments) that there will be external thermal sensors per the SoC 110 or processor 120 as shown in FIG. 1. The thermal alert signal from the processor 120 as well as the SoC 110 external sensors will be routed to the corresponding SoC chip in a SoC-processor platform. Thermal alerts may be used as interrupts by an IST hardware controller 112, 122 in some embodiments to abort test sequences and shutdown the IC 100. Thermal trips occurring during IST execution can power off the IC 100. Design of the IC can be such to ensure that the MCU 135 has enough visibility into shutdown events by routing appropriate control signals to its general purpose input outputs (GPIOs).

For IOs that interface with active external components and don't participate in actual IST operation, system software drives the pads/IO(s) to safe expected values. These states may be maintained throughout IST execution to prevent faulty interaction with external platform components. Software registers may later be sampled into registers of the JTAG controllers of the SoC 110 or processor 120 to retain the states throughout IST test execution. In-system testing also supports re-purposing IOs for different functions based on the requirements of the IC 100. Certain IOs which were functional in one application, could be in static safe mode in another application. For example, an IO may be used to drive an OVR in one platform but in another OVR may be replaced by an I2C based PMIC repurposing the IO for other functions.

The clock source and frequencies as well as voltages can be set by system software prior to executing the IST. The IST hardware controllers (e.g., via the JTAG controllers) capture the settings in the shadow registers and reapply the same by overriding the software registers. Depending on platform form factor or type of targeted faults, voltage and clock frequencies may need to be changed for the test. In some cases, frequency targets may be updated based on the age of the product in field to test for marginal faults.

Figure 4:
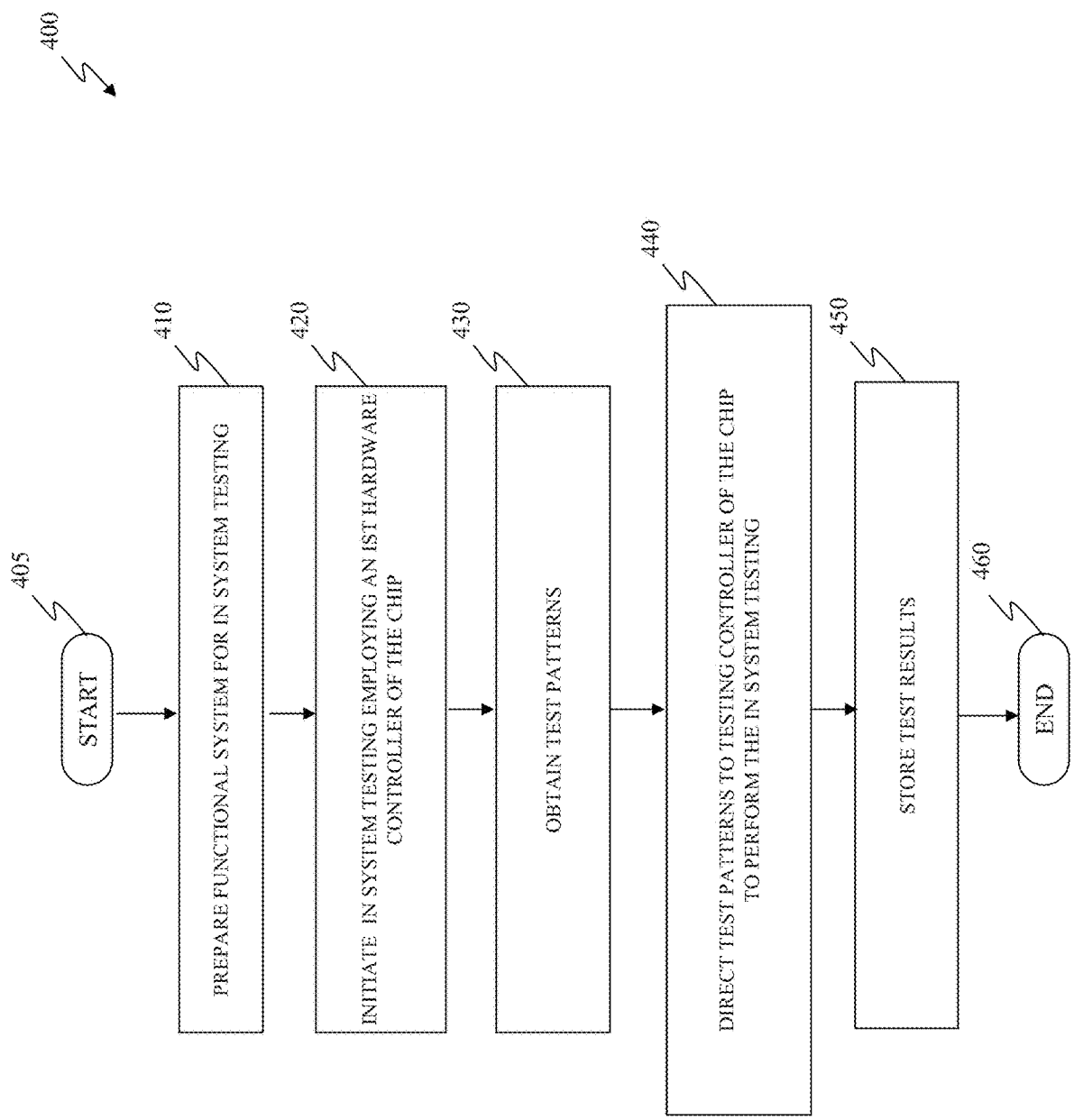
FIG. 4 illustrates a flow diagram of an embodiment of a method of performing in-system testing of a chip of a functional system carried out according to the principles of the disclosure.

FIG. 4 illustrates a flow diagram of an embodiment of a method 400 of performing in-system testing of a chip of a functional system carried out according to the principles of the disclosure. At least a portion of the method 400 can be carried out by an IST hardware controller as disclosed herein. The method 400 begins in a step 405. Step 405 can be initiated by a power transition of the functional system.

In a step 410, the functional system is prepared for the in-system testing. The functional system can be prepared by setting power values, clock frequencies, and voltage values for the functional system that are for the in-system testing. Watchdog timers and I/O contacts can also be configured for the in-system testing.

The in-system testing is initiated employing an IST hardware controller of the chip in a step 420. The IST hardware controller can be initiated by an IST trigger. The IST trigger can be a software trigger. In some examples, the IST trigger is provided by a microcontroller of the functional system.

In a step 430, test patterns for the in-system testing are obtained. The test patterns can be for structural testing. The test patterns can be obtained from an EMMC of the functional system. The test patterns can be for various tests including but not limited to stuck-at faults, transition faults, and coupling faults.

The structural test patterns are directed to test controllers of the chip to perform the in-system testing in a step 440. The IST hardware controller can obtain the test patterns and direct the test patterns to the testing controllers. The testing controllers can be JTAG controllers and scan compression controllers that are on the chip.

In a step 450, the test results from the in-system testing are stored. The test results can be stored in the EMMC via the IST hardware controller. The test results can be used for diagnosing the functional system for system faults. For example, the diagnosing can include identifying, based at least on the test patterns, one or more power regions in the functional system with corresponding test values from the test results below a pre-determined threshold test value. The method 400 then continues to step 460 and ends.

The IST hardware controllers, chips, and the functional systems as disclosed herein support several levels of flexibility in test scheduling as described below and shown in FIGS. 5A, 5B, and 5C. Various examples of test scheduling are provided using three different types of testing as examples. Other testing sequences and other types of testing can be used. In FIGS. 5A, 5B, and 5C the testing is performed on a representative chip and processor that are divided into N different regions. In an example, non-limiting embodiment, the chip can be the SoC 110 and the processor can be the processor 120 of FIG. 1. The processor can be a GPU such as a discrete GPU. Instead of a chip and processor, the testing can be done on two chips, such as two SoCs. In FIGS. 5A, 5B, 5C, the chip is represented by the letter "C" and the processor is represented by the letter "P." The example tests are MBIST, LBIST, and ATPG. An IST hardware controller or controllers as disclosed herein can direct the in-system testing represented in FIGS. 5A to 5C. Some of the test scheduling represented in FIGS. 5A to 5C can be used to reduce power and ensure that power consumption is within a power envelope designated for testing.

The number N of regions can vary depending on various factors including the type of chip and processor, power requirements for testing, and architecture of the system. For example, in non-limiting example embodiments, a chip can have a CPU region, an integrated GPU region and a SoC region. Likewise, in non-limiting example embodiments, a processor may have a graphics processing core region, a file buffer interface region, and a crossbar region. Each of these regions can factor into the division of regions for testing purposes. In one or more embodiments, IST and ATE testing is performed on a region by region basis, and the different tests can be scheduled for different regions that are conducted contemporaneously.

For certain platforms, not all regions are required for testing of the chip. This may be due to the usage model, form factors or power delivery constraints of the platform. Such logic regions are typically power-gated down or not powered externally. IST handles such cases by a combination of hardware and software to test the rest of the domains. Different ways IST can use to handle such scenarios include: having separate tests per platform or generating a single set but modifying the result checking software. The test scheduling provides a way to distribute testing of physical partitions of the chip and processor over multiple IST runs. This feature of IST can be used to better manage test time and still meet the overall safety goals.

FIG. 5A illustrates three rows representing concurrent testing of each region of both the chip and the processor. Row One shows concurrent LBIST testing for each of the regions of the chip and processor. Row Two shows concurrent LBIST testing for each of the regions of the chip and processor. Row Three shows concurrent testing for each of the regions of the chip and processor employing MBIST testing on the chip and LBIST testing on the processor.

FIG. 5B illustrates four rows representing test scheduling. Row 1 represents concurrent testing of each region of both the chip and the processor. Row One shows concurrent LBIST testing for each of the regions of the chip and MBIST testing for each of the regions of the processor. Rows 2 to 4 specifically refer to testing of the chip. Row 2 illustrates concurrent testing of each region of the chip with LBIST testing of regions 1 and 2 and ATPG testing of region N. Rows 3 and 4 show testing sequential testing of the different regions of the chip. Row 3 shows ATPG testing in region N, then region 1, and region 2. Row 4 shows the same sequence with LBIST testing of the chip regions.

FIG. 5C also illustrates four rows representing test scheduling for the chip. Row 1 shows MBIST testing in region N, then region 1, and region 2 of the chip. Rows 2 to 4 illustrate partial testing of the different regions of the chip. Row 2 illustrates concurrent MBIST testing of first portions of the regions of the chip and then concurrent MBIST testing of the remaining portions of the regions of the chip. Row 3 illustrates concurrent LBIST testing of first portions of the regions of the chip and then concurrent LBIST testing of the remaining portions of the regions of the chip. Row 4 illustrates partial ATPG testing of region N in two different portions and partial ATPG testing of region 2.

The partial testing of regions can be performed based on active regions of the chip or processor. This can be performed in multiple ways. For example, a test sequence can be run for an entire region but results coming from an inactive region are ignored. In another example, the test sequence can be run the active region only and the inactive region can be kept idle.

Figure 6:
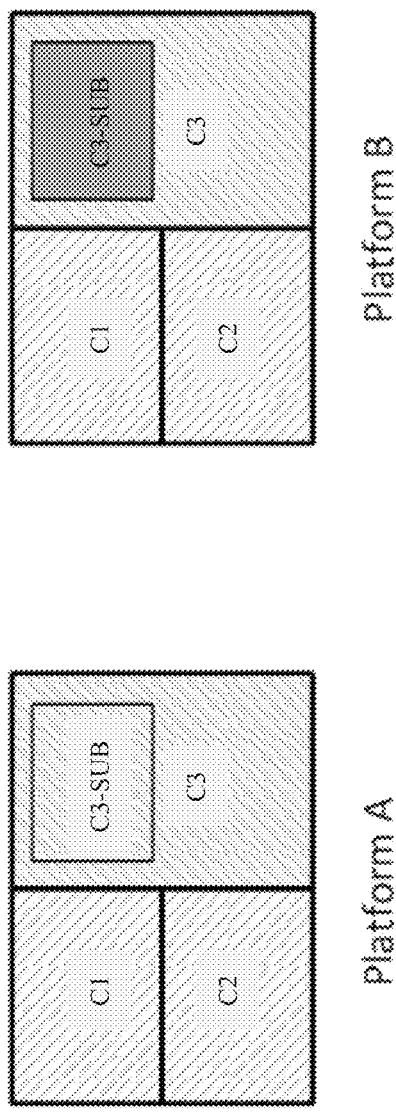
FIG. 6 illustrates a Platform A and a Platform B in accordance with the disclosure.

FIG. 6 illustrates a diagram of two different computing platforms for in-system testing. FIG. 6 illustrates that a common set of test patterns can be used for various platform configurations based of the same chip. For example, a common set of test patterns can be used for LBIST testing of regions 1 and 2 of the same chip of both Platform A and Platform B. ATPG testing can also be performed on region 3 of the same chip of both Platform A and Platform B. Region(s) may be disabled and powered for a particular platform based on usage or power. For example, the sub regions of region 3 for Platform A and Platform B can be powered for testing based on usage or power.

In contrast to existing apparatuses, systems and methods, the disclosed apparatus, system or method uses electronic design automation (EDA) tools and industry standard algorithms to quantify coverage for nodes in the design of a chip upfront during test development and tests can be developed easily using the same tools based on physical structure of the design. Moreover, the disclosure provides a mechanism to diagnose failures in a system over the life of the product to the level of flop or bit cell which is advantageous over existing functional testing techniques. The disclosure supports multiple fault models and algorithms and tests based on these can be updated in the field to improve coverage over the life cycle of the product. The disclosure supports updating the test conditions like clock sources, frequencies and voltage in the field and supports a common set of test patterns for various platform configurations based of the same chip. Region(s) may be disabled and powered for a particular platform based on usage or power. The disclosure supports ignoring the results on specific flop(s) or memories and tests or results can be updated based on this in the field. In this technique, most of the system is in test configuration to maximize the coverage. Dedicated IST hardware controllers have direct communication links to platform components for test data and result storage, interrupts and power cycling.

Accordingly, the present disclosure enables testing a complex SoC system for logic and memory structural faults in the field to improve safety and reliability. It supports updating tests and their application sequence, targeted fault models and test conditions like voltage and clock frequencies over the life cycle of the product. The scheme also enables diagnosis of failures in the field to the granularity of flop and memory instance.

A portion of the above-described apparatus, systems or methods may be embodied in or performed by various digital data processors, wherein the processors are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. An in-system test (IST) hardware controller included within a chip of a functional computing platform, comprising:
    an interface that receives test patterns for structural testing of a chip of a functional computing platform; and
    a processor that directs the test patterns to a centralized testing controller of the chip for in-system testing of the chip, wherein the chip is divided into multiple regions, and the in-system testing includes applying, using the centralized testing controller, different tests to different regions of chip concurrently;
    wherein the IST hardware controller updates, while the chip is being used in the functional computing platform, at least one application sequence of the in-system testing, one or more targeted fault modes of the in-system testing, and one or more test conditions of the in-system testing.

2. The IST hardware controller as recited in claim 1 wherein the in-system testing includes at least one of: applying a same test to different portions of a region at different times, applying different tests to different regions of the chip concurrently, applying the different tests to the different regions of the chip sequentially, applying the same test to a subset of regions of the chip concurrently, applying the same test to the subset of regions of the chip sequentially, applying the same test to all regions of the chip concurrently, or applying the same test to each region of the chip sequentially.

3. The IST hardware controller as recited in claim 1 wherein the interface directly communicates with components of the platform, receives the test patterns from a memory component of the platform components, and receives an IST trigger from a boot controller of the platform components.

4. The IST hardware controller as recited in claim 1 wherein the in-system testing detects a failure in the chip to a level of bit cell.

5. The IST hardware controller as recited in claim 1 wherein the multiple regions include an active region, and the in-system testing runs only on the active region.

6. The IST hardware controller as recited in claim 5 wherein the active region corresponds to a particular flop or memory instance.

7. The IST hardware controller as recited in claim 1 wherein the centralized testing controller includes a JTAG controller and a scan compressor of the chip.

8. The IST hardware controller as recited in claim 1 wherein the test patterns are capable of being used for a testing of the chip in a different function platform.

9. The IST hardware controller as recited in claim 1 wherein the IST hardware controller further comprises a chip interface that communicates with another IST hardware controller of a different chip of the functional computing platform.

10. A method of performing in-system testing of a chip of a functional system, the method comprising:
    preparing the functional system for the in-system testing;
    initiating the in-system testing employing an IST hardware controller of the chip;
    obtaining test patterns for the in-system testing;
    directing the test patterns to a centralized test controller of the chip to perform the in-system testing, wherein the chip is divided into multiple regions, the in-system testing includes applying, using the centralized test controller, different tests to different regions concurrently; and
    updating, while the chip is being used in the functional system, at least one application sequence of the in-system testing, one or more targeted fault modes of the in-system testing, and one or more test conditions of the in-system testing.

11. The method as recited in claim 10, wherein the in-system testing includes at least one of: applying a same test to different portions of a region at different times, applying different tests to different regions of the chip concurrently, applying the different tests to the different regions of the chip sequentially, applying the same test to a subset of regions of the chip concurrently, applying the same test to the subset of regions of the chip sequentially, applying the same test to all regions of the chip concurrently, or applying the same test to each region of the chip sequentially.

12. The method as recited in claim 11 wherein the test patterns are obtained directly from an EMMC of the functional system.

13. The method as recited in claim 10 wherein the multiple regions include an active region, and the in-system testing runs only on the active region.

14. The method as recited in claim 10 wherein the test patterns correspond to one or more tests selected from the list comprising:
   one or more tests to detect stuck-at faults,
   one or more tests to detect transition faults, or
   one or more tests to detect coupling faults.

15. The method as recited in claim 10 wherein the centralized testing controller includes a JTAG controller and a scan compression controller that are integrated on the chip.

16. The method as recited in claim 10 further comprising initiating a boot process for the chip based on a power transition of the chip, wherein the boot process includes code for executing steps associated with the in-system testing.

17. The method as recited in claim 10 wherein the preparing the functional system for the in-system testing includes driving input/output contacts of the chip that interface with active external components and are not part of the in-system testing to safe expected values, and maintaining the safe expected values throughout the in-system testing to prevent a faulty interaction with external platform components.

18. The method as recited in claim 10 further comprising detecting system faults to a level of bit cell of the functional system based on test results obtained from performing the in-system testing.

19. The method as recited in claim 18 wherein the detecting system faults comprises identifying, based at least on the test patterns, one or more power regions in the functional system with corresponding test values from the test results below a pre-determined threshold test value.

20. An integrated circuit (IC) within a functional system, comprising:
   components of the functional system; and
   a system-on-a-chip (SoC) having a first in-system test (IST) hardware controller communicatively coupled to the components of the functional system, wherein the first IST hardware controller directs in-system testing of the SoC employing a centralized testing controller of the SoC, and the SoC is divided into multiple regions, and the in-system testing includes applying, using the centralized test controller, different tests to different regions concurrently,
   wherein the first IST hardware controller updates, while the SoC is being used in the functional computing platform, at least one application sequence of the in-system testing, one or more targeted fault modes of the in-system testing, and one or more test conditions of the in-system testing.

21. The IC as recited in claim 20 further comprising a GPU having testing controllers and a second IST hardware controller that is uniquely coupled to the first IST hardware controller, wherein the components include an EMMC, a PMIC, a microcontroller, a first thermal sensor for the SoC, and a second thermal sensor for the GPU.

22. The IC as recited in claim 21 wherein the first IST hardware controller and the second IST hardware controller direct test patterns obtained from the EMMC to the testing controllers of the SoC and the GPU for in-system testing of the SoC and the GPU, and send test results from the in-system testing to the EMMC for storage.

\* \* \* \* \*